US009219450B1

(12) United States Patent
Helms et al.

(10) Patent No.: US 9,219,450 B1
(45) Date of Patent: Dec. 22, 2015

(54) HIGH LINEARITY LOW NOISE AMPLIFIER

(71) Applicant: Lockheed Martin Corporation, Bethesda, MD (US)

(72) Inventors: David R. Helms, Tyngsboro, MA (US); Peter W. Fox, Jr., Lumberton, NJ (US); Thomas P. Higgins, Mount Laurel, NJ (US); William G. Trueheart, Jr., Sewell, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 16 days.

(21) Appl. No.: 14/149,306

(22) Filed: Jan. 7, 2014

(51) Int. Cl.
*H03F 3/21* (2006.01)
*H03F 3/193* (2006.01)
*H03F 1/22* (2006.01)

(52) U.S. Cl.
CPC .................. *H03F 3/21* (2013.01); *H03F 1/223* (2013.01); *H03F 3/193* (2013.01); *H03F 1/22* (2013.01)

(58) Field of Classification Search
CPC ........... H03F 3/193; H03F 1/223; H03F 3/68; H03F 3/211; H03F 2200/294; H03F 3/45179; H03F 3/72; H03F 3/195; H03F 3/245; H03F 1/3205; H03F 2200/451; H03F 2200/541; H03F 1/0205; H03F 1/086; H03F 1/03
USPC ..................................... 330/277, 311
See application file for complete search history.

(56) References Cited

U.S. PATENT DOCUMENTS

| | | | | |
|---|---|---|---|---|
| 4,342,967 | A * | 8/1982 | Regan et al. ................... | 330/311 |
| 5,015,968 | A * | 5/1991 | Podell et al. ................... | 330/302 |
| 5,742,205 | A * | 4/1998 | Cowen et al. .................. | 330/311 |
| 6,011,438 | A * | 1/2000 | Kakuta et al. .................. | 330/262 |
| 6,496,069 | B1 * | 12/2002 | Van De Westerlo .......... | 330/311 |
| 6,864,750 | B2 * | 3/2005 | Shigematsu ................... | 330/311 |
| 8,665,022 | B2 | 3/2014 | Kobayashi | |
| 2012/0194276 | A1 | 8/2012 | Fisher | |

* cited by examiner

*Primary Examiner* — Khanh V Nguyen
(74) *Attorney, Agent, or Firm* — Howard IP Law Group, PC

(57) ABSTRACT

A two-stage RF amplifier comprising first and second transistors arranged in cascode. An input stage includes a common source transistor having a gate terminal responsive to an input signal and an output stage includes a common gate transistor having a source terminal operatively connected to the drain terminal of the common source transistor. A shunt feedback network is arranged between a drain terminal of the common gate transistor and the gate terminal of the common source transistor. A source feedback network is arranged between the source terminal of the common source transistor and a reference potential. A common gate feedback network is arranged between the drain terminal of the common gate transistor and a gate terminal of the common gate transistor. And a termination feedback network is arranged in series between the reference potential and the gate terminal of the common gate transistor.

17 Claims, 3 Drawing Sheets

HIGH LINEARITY LOW NOISE AMPLIFIER

FIELD OF THE INVENTION

The present invention relates to power amplifiers, and more particularly, to low noise amplifiers used in high dynamic range systems.

BACKGROUND

Next generation radar systems require an order of magnitude greater dynamic range, without additional power consumption. Accordingly, low noise amplifiers (LNAs) and other components used in these systems must have reasonable gain, low noise, low power dissipation and high linearity. Cascode amplifier arrangements, including those utilizing field-effect transistors (FETs), are known to improve some of these characteristics. Silicon (Si) bipolar junction transistor (BJT) devices may also be used, however, at the expense of increased noise. As presently implemented, these amplifier arrangements are not sufficiently linear. Moreover, these types of amplifiers are often implemented as a plurality of multistage distributed amplifiers, resulting in large and costly arrangements.

Alternative systems and methods are desired for providing high linearity, wide bandwidth, low noise amplifiers offering improved packaging and production capabilities.

SUMMARY

According to one embodiment of the present invention, a cascode amplifier is provided. The amplifier includes an input stage including a common source transistor having a gate terminal responsive to an input signal, and an output stage including a common gate transistor having a source terminal operatively connected to the drain terminal of the common source transistor. A shunt feedback network is arranged between a drain terminal of the common gate transistor and the gate terminal of the common source transistor. A source feedback network is arranged between the source terminal of the common source transistor and a reference potential. A common gate feedback network is arranged between the drain terminal of the common gate transistor and a gate terminal of the common gate transistor. Finally, a termination feedback network is arranged in series between the reference potential and the gate terminal of the common gate transistor.

A method of amplifying an input signal is also provided. The method includes the steps of providing a first transistor and a second transistor configured as a two-stage cascode amplifier. The method further comprises the steps of: 1) connecting a drain terminal of the common gate transistor to a gate terminal of the common source transistor via shunt feedback network, 2) connecting the source terminal of the common source transistor to a reference potential via a source feedback network, 3) connecting the drain terminal of the common gate transistor to a gate terminal of the common gate transistor via a common gate feedback network, and 4) connecting the gate terminal of the common gate transistor to the reference potential via a termination feedback network.

DETAILED DESCRIPTION

Figure 1:
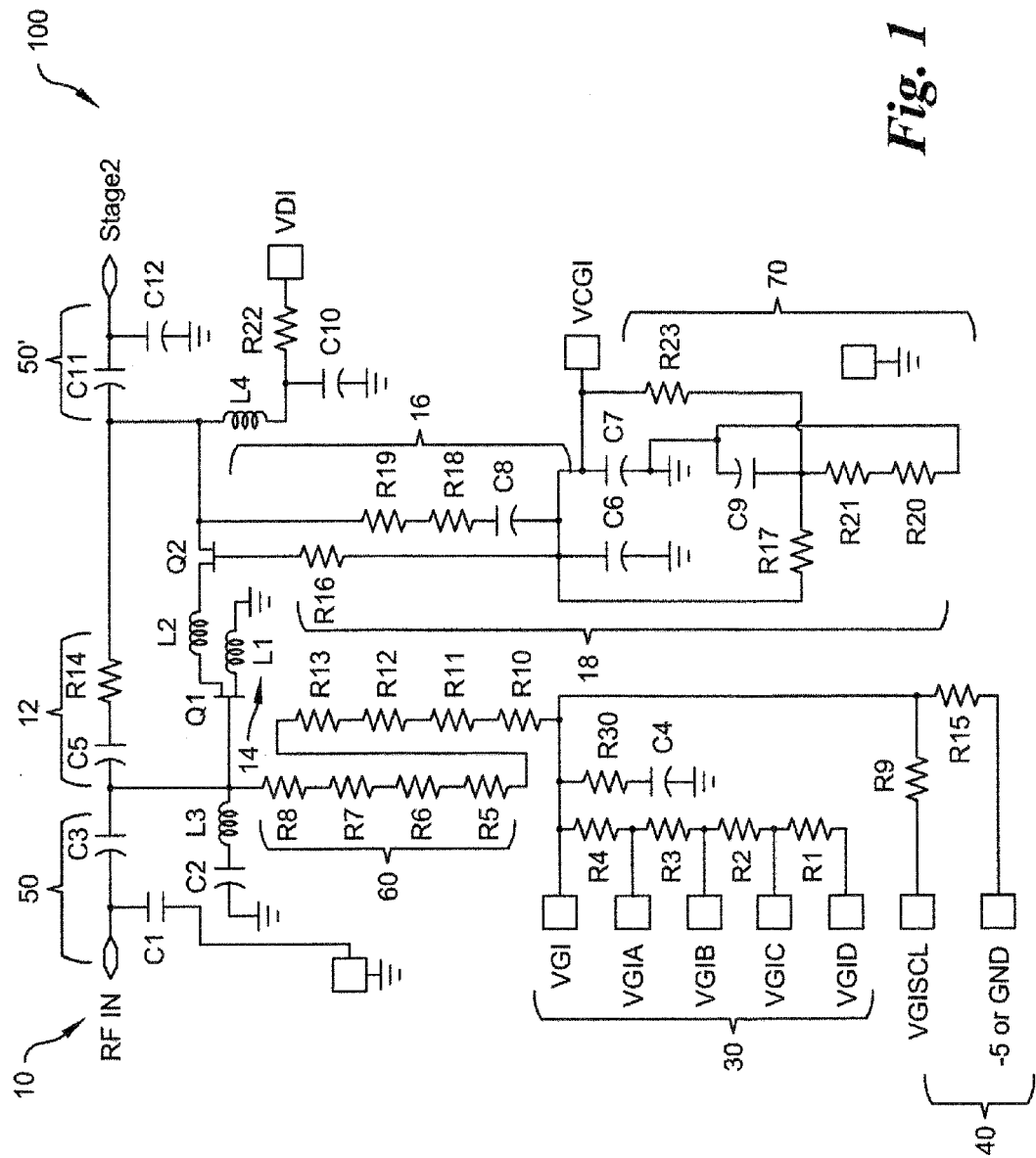
FIG. 1 is circuit diagram of a cascode amplifier according an embodiment of the present disclosure.

It is to be understood that the figures and descriptions of the present invention have been simplified to illustrate elements that are relevant for a clear understanding of the present invention, while eliminating, for purposes of clarity, many other elements found in RF circuits, including multi-stage RF amplifiers. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure are aimed at providing improved low-noise amplifier (LNA) arrangements offering low gain, low noise, low power consumption and high linearity over devices of the prior art. Embodiments include multi-stage amplifiers, with each stage comprising a cascode amplifier circuit utilizing FETs, such as pulse or spiked doped gallium nitride (GaN) FETs. Each amplifier stage includes an input sub-stage including a common source FET having a gate terminal responsive to an input signal, and an output sub-stage including a common gate FET driven by the input sub-stage via a source terminal operatively connected to the drain terminal of the common source transistor. The combination of high-linearity cascode arrangements, as well as FETs with improved linearity, yield significant improvements over devices of the prior art.

Further, cascode amplifier arrangements according to embodiments of the present disclosure implement four types of feedback, providing for flat gain, greater stability and low noise. Embodiments also include the implementation of an enable/disable network configured to control the on/off timing of the amplifier stage. Matching input/output transformers comprising a pair of capacitors and a resonating inductor may also be provided, resulting in an amplifier possessing a double gain peak.

Referring generally to FIG. 1, an exemplary cascode amplifier 100 is provided. Amplifier 100 is responsive to a radio frequency (RF) input source 10 operatively connected to the gate terminal of a common source transistor Q1 comprising the first amplifier sub-stage. A second amplifier sub-stage comprising transistor Q2 is arranged in cascode with Q1, having its source terminal connected to the drain terminal of transistor Q1.

In one exemplary embodiment of the present disclosure, the first and second amplifier stages may be connected via an inter-stage inductance. In the illustrated embodiment, inductor L2 is arranged between the output drain terminal of the first sub-stage transistor Q1, and the input source terminal of the second sub-stage transistor Q2. Inductor L2 acts to match or absorb the intrinsic capacitances of transistors Q1 and Q2, providing greater RF bandwidth and greater RF gain. Inductor L2 may take the form of a spiral or microstrip inductor, by way of non-limiting example.

Amplifiers according to the present disclosure include the use of four types of feedback. Still referring to FIG. 1, a first or shunt feedback network 12 comprises at least one resistance (e.g. resistor R14) arranged in series with a blocking capacitor C5 for connecting the output drain terminal of transistor Q2 and the input gate terminal of transistor Q1. This arrangement sets the closed-loop gain of the cascode lower than that of the open-loop gain, enabling a substantially flat gain over the entire operating band. In addition, the reduction in gain provides improved broad band stability.

A second or source feedback network 14, is also provided. In the illustrated embodiment, source feedback network 14 includes at least one inductor L1 arranged between the source terminal of transistor Q1 and a ground reference. The inductive reactance multiplied by the transconductance sets the input impedance of the cascode. This inductance pushes the input match to allow a simultaneous noise and gain match and aids in gain flatness.

A third or common gate feedback network 16 is also provided. The common gate feedback comprises a resistance in the form of resistors R16, R19 in series with a blocking capacitor C8 for connecting the drain and gate terminals of transistor Q2. This arrangement functions to set the closed loop gain of transistor Q2 lower than that of the open loop gain, improving gain flatness over the entire operating band and promoting broad band stability.

The fourth or termination feedback network 18 comprises a resistance (e.g. resistor R16) and a blocking capacitor C6 arranged between the gate terminal of transistor Q2 and a ground reference. The magnitude of the capacitance of capacitor C6 sets the gain slope, with the higher the capacitive reactance, the lower the cascode gain. The reactance is set to give a target gain value depending on the particular application. Arranging a termination resistance in series with a capacitor acts as a feedback to limit the minimum impedance of that gate. Thus, this RC network stabilizes the common gate gain over the entire operating bandwidth of the transistor.

Embodiments of the present disclosure further include an enable/disable network 40 allowing for selective on/off control of amplifier 100. Enable network 40 operates by applying a reference potential (e.g. ground) performed by network 40 to one end of a bias ladder 30, while a second end of bias ladder 30 is held at, for example, minus five volts (−5V). Bias ladder 30 combines networks 30 and 40. Network 30 comprises a voltage divider, including resistors R1-R4 arranged in series, with respective with taps (e.g. bond pads) to alter the voltage division. Network 40 enables network 30 by applying a reference potential (e.g. ground) to the enable pin at network 40. In one embodiment, the ground connection at the first end of bias ladder 30 is terminated into a minus voltage supply, the second end at network 40 goes off chip into a transistorized short, or open, that is on a separate die such that when the open is applied it causes the current in bias ladder 30 to fall to zero. The resulting output of bias ladder 30 falls to −5V, and thus, the gate of transistor Q1 is down-biased to an off condition.

Arranged between bias ladder 30 and the gate of transistor Q1 is a high-value bias resistance network 60. Resistance network 60 comprises a chain of resistors R5-R13 arranged in series for protecting the amplifier from high power inputs or surges.

Arranged between feedback networks 16 and 18 is bias/resonance removal network 70. Network 70 comprises resistors R20 and R21 in series with capacitor C9. Resistors R20 and R21 act in series with the capacitive reactance of C9 to lower any peak reactance of capacitor C9, suppressing any resonance in network 70 and networks 16 and 18.

In one exemplary implementation, an amplifier according to embodiments of the present disclosure includes a plurality (e.g. three) of the amplifiers 100 of FIG. 1 arranged in series. In order to improve the performance of this multi-stage arrangement, embodiments of the present disclosure further include the use of matching transformers on the input and output of each amplifier stage 100. An input transformer 50 comprises a pair of capacitors and an inductor C1, C3, and L3. A corresponding output transformer 50' comprises inductor L4 and capacitors C10 and C11.

Figure 2:
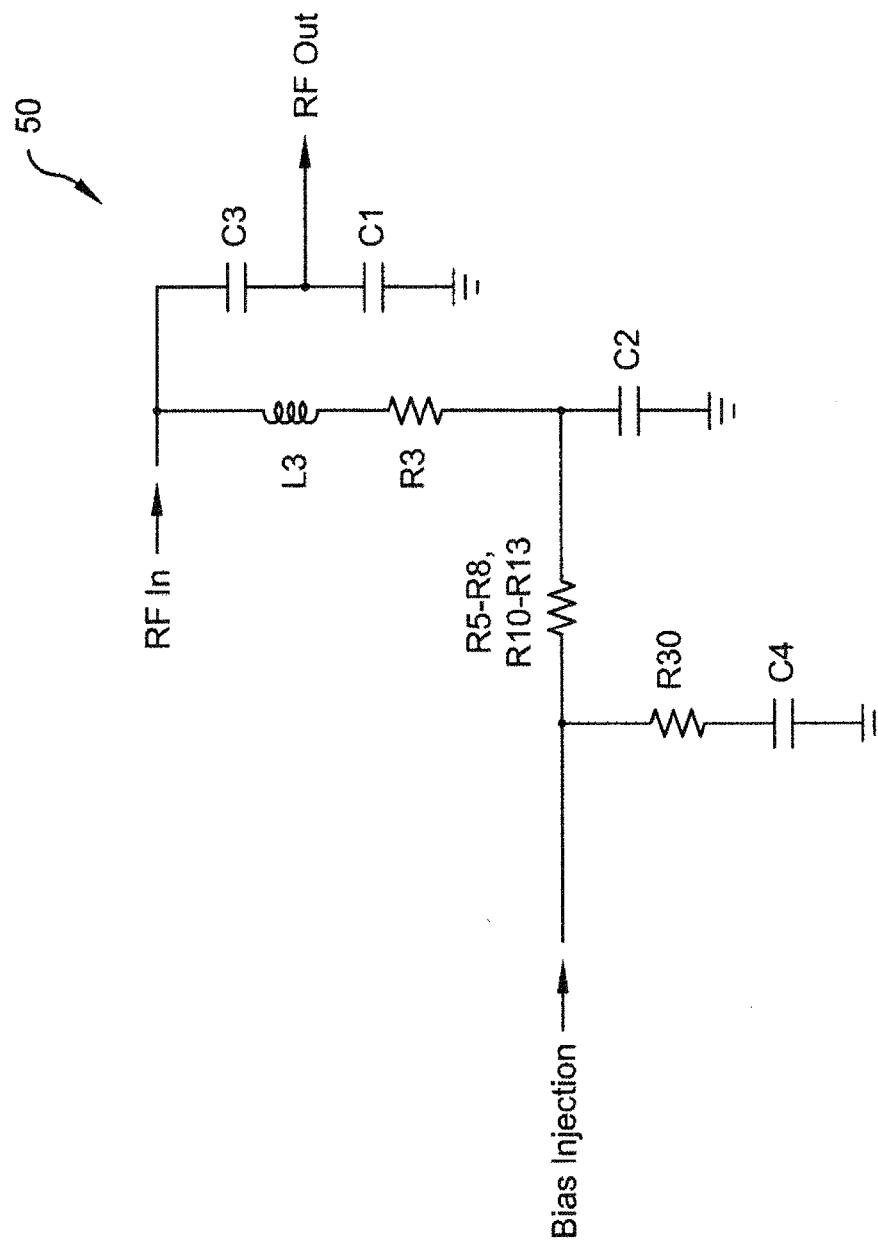
FIG. 2 is a circuit diagram of a matching transformer circuit according to an embodiment of the present disclosure.

A simplified schematic of the exemplary matching transformer 50 is shown in FIG. 2. Transformer 50 functions to shift impedances from low to high, or low to high, over large bandwidths. Capacitors C3 and C1 differ in size and are arranged in series to a ground reference. Capacitor C3 is the input for the highest impedance. The junction between the two capacitors is the point of lower impedance. The total capacitance of the two capacitors sets the high impedance. Setting the relative sizes of the two capacitors sets the lower impedance. Inductance L3 in parallel with the two capacitors acts as a parallel resonator to set the frequencies where the transformer is used. A lossy tank comprising resistor R30 and capacitor C4 is used with the transformer to provider greater bandwidth and to flatten out the gain response.

Figure 3:
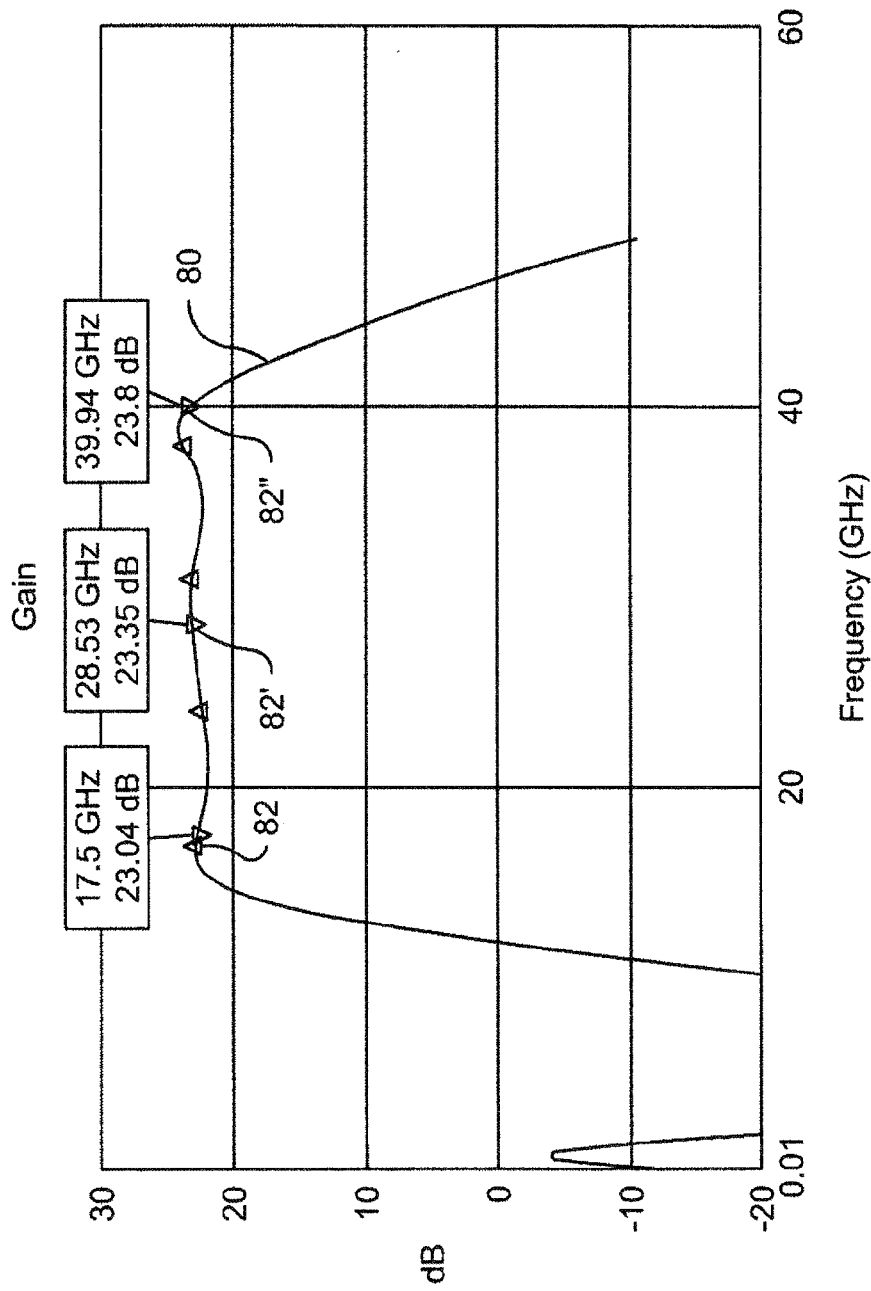
FIG. 3 is a graphical representation of the performance of a cascode amplifier according to embodiments of the present disclosure.

Referring generally to FIG. 3, amplifier arrangements utilizing the above-described input and output matching transformers 50,51 provide exceptionally flat gain over a wide bandwidth. Gain trace 60 illustrates three gain peaks 82,82', 82" within a single dB occurring over greater than 20 GHz, while maintaining low noise over the entire bandwidth.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A cascode amplifier comprising:
   an input stage including a common source transistor having a gate terminal responsive to an input signal;
   an output stage including a common gate transistor having a source terminal operatively connected to the drain terminal of the common source transistor;
   a shunt feedback network arranged between a drain terminal of the common gate transistor and the gate terminal of the common source transistor;
   a source feedback network arranged between the source terminal of the common source transistor and a reference potential;
   a common gate feedback network comprising at least one capacitor and at least one resistor arranged in series between the drain terminal of the common gate transistor and a gate terminal of the common gate transistor; and
   a termination feedback network arranged in series between the reference potential and the gate terminal of the common gate transistor.

2. The amplifier of claim 1, further comprising an inductor arranged between the input stage and the output stage.

3. The amplifier of claim 2, wherein the inductor is arranged between the drain terminal of the common source transistor and the source terminal of the common gate transistor.

4. The amplifier of claim 1, wherein the source feedback network comprises an inductor arranged between the source terminal of the common source transistor and the reference potential.

5. The amplifier of claim 1, wherein the termination feedback network comprises at least one capacitor and at least one resistor arranged in series.

6. The amplifier of claim 1, wherein the shunt feedback network comprises at least one capacitor and at least one resistor arranged in series.

7. The amplifier of claim 1, further comprising a matching transformer arranged at the input of the amplifier configured to lower an input impedance.

8. The amplifier of claim 1, wherein the reference potential is a ground reference.

9. A cascode amplifier comprising:
   an input stage including a common source transistor having a gate terminal responsive to an input signal;
   an output stage including a common gate transistor having a source terminal operatively connected to the drain terminal of the common source transistor;
   a shunt feedback network arranged between a drain terminal of the common gate transistor and the gate terminal of the common source transistor;
   a source feedback network arranged between the source terminal of the common source transistor and a reference potential;
   a common gate feedback network arranged between the drain terminal of the common gate transistor and a gate terminal of the common gate transistor;
   a termination feedback network arranged in series between the reference potential and the gate terminal of the common gate transistor; and
   a network of resistors arranged in series operatively connected to the gate terminal of the common source transistor.

10. The amplifier of claim 9, further comprising a voltage divider operatively connected to the network of resistors.

11. The amplifier of claim 10, further comprising an enable network operatively connected to the voltage divider and the network of resistors bias, the enable network configured to control the on/off timing of the common source transistor by altering a bias provided at the gate terminal thereof.

12. A method of amplifying an input signal, said method comprising the steps of:
    providing a first and a second transistor configured as a two-stage cascode amplifier;
    connecting a drain terminal of the common gate transistor to the gate terminal of the common source transistor via shunt feedback network;
    connecting the source terminal of the common source transistor to a reference potential via a source feedback network;
    connecting the drain terminal of the common gate transistor to a gate terminal of the common gate transistor via a common gate feedback network comprising at least one capacitor and at least one resistor arranged in series; and
    connecting the gate terminal of the common gate transistor to the reference potential via a termination feedback network.

13. The method of claim 12, further comprising the step of arranging an inductor between the input stage and the output stage.

14. The method of claim 13, wherein the inductor is arranged between the drain terminal of the common source transistor and the source terminal of the common gate transistor.

15. The method of claim 12, wherein the source feedback network comprises an inductor connected between the source terminal of the common source transistor and the reference potential.

16. The method of claim 12, wherein the termination feedback network comprises at least one capacitor and at least one resistor arranged in series.

17. The method of claim 12, wherein the shunt feedback network comprises at least one capacitor and at least one resistor arranged in series.

* * * * *

UNITED STATES PATENT AND TRADEMARK OFFICE
CERTIFICATE OF CORRECTION

| | | |
|---|---|---|
| PATENT NO. | : 9,219,450 B1 | Page 1 of 1 |
| APPLICATION NO. | : 14/149306 | |
| DATED | : December 22, 2015 | |
| INVENTOR(S) | : David R. Helms et al. | |

It is certified that error appears in the above-identified patent and that said Letters Patent is hereby corrected as shown below:

Claims

Claim 11, line 18 delete the word "bias".
Claim 11 should read as follows:

11. The amplifier of claim 9, further comprising an enable network operatively connected to the voltage divider and the network of resistors, the enable network configured to control the on/off timing of the common source transistor by altering a bias provided at the gate terminal thereof.

Signed and Sealed this
Tenth Day of May, 2016

Michelle K. Lee
*Director of the United States Patent and Trademark Office*